US010727372B2

(12) United States Patent
Chowdhury et al.

(10) Patent No.: US 10,727,372 B2
(45) Date of Patent: Jul. 28, 2020

(54) DILUTE-ANTIMONIDE GROUP-III-NITRIDE NANOSTRUCTURE OPTOELECTRONIC DEVICES

(71) Applicant: THE REGENTS OF THE UNIVERSITY OF MICHIGAN, Ann Arbor, MI (US)

(72) Inventors: Mohammad Faqrul Alam Chowdhury, Montreal (CA); Zetian Mi, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 16/030,855

(22) Filed: Jul. 9, 2018

(65) Prior Publication Data

US 2019/0013440 A1    Jan. 10, 2019

Related U.S. Application Data

(60) Provisional application No. 62/529,915, filed on Jul. 7, 2017.

(51) Int. Cl.
| | | |
|---|---|---|
| *H01L 21/00* | (2006.01) | |
| *H01L 33/32* | (2010.01) | |
| *H01L 33/06* | (2010.01) | |
| *H01L 33/20* | (2010.01) | |
| *H01L 33/00* | (2010.01) | |
| *H01L 27/15* | (2006.01) | |
| *H01L 33/44* | (2010.01) | |
| *H01L 33/42* | (2010.01) | |
| *H01L 33/24* | (2010.01) | |

(Continued)

(52) U.S. Cl.
CPC .......... *H01L 33/325* (2013.01); *H01L 27/156* (2013.01); *H01L 33/0075* (2013.01); *H01L 33/06* (2013.01); *H01L 33/08* (2013.01); *H01L 33/18* (2013.01); *H01L 33/20* (2013.01); *H01L 33/24* (2013.01); *H01L 33/32* (2013.01); *H01L 33/42* (2013.01); *H01L 33/44* (2013.01); *H01L 2933/0025* (2013.01)

(58) Field of Classification Search
CPC . H01L 33/325; H01L 27/156; H01L 33/0075; H01L 33/06; H01L 33/08; H01L 33/18; H01L 33/20; H01L 33/24; H01L 33/32; H01L 33/42; H01L 33/44
See application file for complete search history.

(56) References Cited

U.S. PATENT DOCUMENTS

2018/0261455 A1*    9/2018  Ooi .................. C30B 23/025

OTHER PUBLICATIONS

Murdin et al., "Dilute Antimonide Nitrides for very long wavelength infared applications", Procedings of SPIE, Jan. 2006, pp. 1-8.*

* cited by examiner

*Primary Examiner* — Richard A Booth

(57) ABSTRACT

A nanostructure optoelectronic device, in accordance with aspects of the present technology, can include a group-III element semiconductor with a first type of doping, one or more quantum structures including a dilute-Antimonide group-III-Nitride disposed on the first type of doped group-III element semiconductor, and a group-III element semiconductor with a second type of doping disposed on the dilute-Antimonide group-III-Nitride. The concentration of the Antimony (Sb) can be adjusted to vary the energy bandgap of the dilute-Antimonide group-III-Nitride between 3.4 and 2.0 electron Volts (eV)

21 Claims, 9 Drawing Sheets

(51) Int. Cl.
*H01L 33/08* (2010.01)
*H01L 33/18* (2010.01)

DILUTE-ANTIMONIDE GROUP-III-NITRIDE NANOSTRUCTURE OPTOELECTRONIC DEVICES

CROSS-REFERENCE TO RELATED APPLICATIONS

This Application claims the benefit of U.S. Provisional Patent Application No. 62/529,915 filed Jul. 7, 2017, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing device and other electronics are displays based on Light-Emitting Diodes (LEDs).

Research in Gallium Nitride (GaN) based materials, including Indium Gallium Nitride (InGaN) Quantum Wells (QWs), has led to high brightness blue LEDs. However, it has remained challenging to achieve efficient light emitter operating in the deep visible spectral range. Accordingly, there is a continuing need for improved optoelectronic devices.

SUMMARY OF THE INVENTION

The present technology may best be understood by referring to the following description and accompanying drawings that are used to illustrate embodiments of the present technology directed toward nanostructure optoelectronic devices.

In one embodiment, a nanowire can include a first portion including a group-III element semiconductor with a first type of doping (e.g., n-doped). A second portion including one or more quantum structures can be disposed on the first portion. A third portion including a group-III element semiconductor with a second type of doping (e.g., p-doping) can be disposed on the second portion opposite the first portion. The one or more quantum structures can be quantum dots, quantum disks, quantum arch-shaped elements, quantum wells, or one or snore combinations thereof such as quantum dots within a quantum well. The one or more quantum structures can include a dilute-Antimonide group-III-Nitride, wherein the concentration of the Antimony (Sb) can be adjusted to vary the energy bandgap of the dilute-Antimonide group-III-Nitride between 3.4 and 2.0 electron Volts (eV).

In another embodiment, an optoelectronic device can include one or more clusters of nanowires. The nanowires can include a first semiconductor region, a quantum structure disposed on the first semiconductor region, and a second semiconductor region disposed on the quantum structure. The quantum structure can include a dilute-Antimonide group-III-Nitride with a concentration of Antimony (Sb) of one percent (1%) or less.

In another embodiment, a method of fabricating a nanowire can include iteming a group-III semiconductor with a first type of doping. A quantum structure including a dilute-Antimonide group-III-Nitride can be formed on the first type doped group-III semiconductor. A group-III semiconductor with a second type of doping can be formed on the quantum structure.

In yet another embodiment, a method of fabricating an optoelectronic device including one or more clusters of nanowires can include depositing a group-III element semiconductor with a first type of doping. A dilute-Antimonide group-III-Nitride can be deposited on the first type of doped group-III element semiconductor. A group-III element semiconductor can be deposited on the dilute-Antimonide group-III-Nitride. A group-III element semiconductor with a second type of doping can be deposited on the group-III element semiconductor. The dilute-Antimonide group-III-Nitride can be epitaxially deposited with a concentration of Antimony (Sb) of one percent (1%) or less, at a temperature in the range of 650 to 705 degrees Centigrade (° C.).

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF TOE DRAWINGS

Embodiment of the present technology are illustrated by way of example and not by way of limitation, in the figures of the accompanying drawings and in which like reference numerals refer to similar elements and in which.

DETAILED DESCRIPTION OF THE INVENTION

Figure 1:
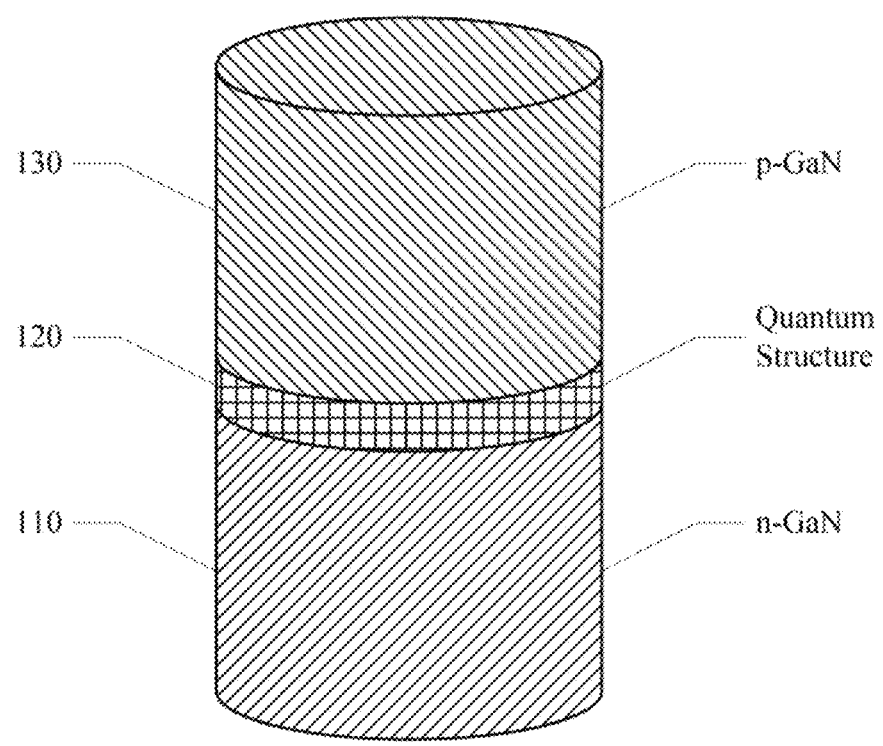
FIG. 1 shows a nanowire, in accordance with aspects of the present technology.

Reference will now be made in detail to the embodiment of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "first," "second" and the like is not intended to specify any sort of order, instead such terms are used to differentiate elements. It is also to be understood that the phraseology and terminology used herein is for the purpose of description and should not be regarded as limiting.

FIG. 1 shows a nanowire, in accordance with aspects of the present technology. The nanowire 100 can include a first semiconductor region 110, a quantum structure 120 disposed on the first semiconductor region 110, and a second semiconductor region 130 disposed on the quantum well structure 120. The nanowire 100 can have a cylindrical, hexagonal, rectangular, triangular, or similar cross section. In one implementation, the first semiconductor region 110 can include a n-type doped group-III element semiconductor, such as Gallium Nitride (GaN). The quantum well structure 120 can include a dilute-Antimonide (Sb) group-III-Nitride that includes 1% or less of Antimony (Sb) The second semiconductor region 130 can include a p-type doped group-III element semiconductor, such as Gallium Nitride (GaN).

In aspects, the quantum structure 120 can be a quantum active layer structure including one or more quantum layers of Gallium Antimonide Nitride (GaSbN) and Gallium Nitride (GaN). The quantum active layer structure 120 can include one or more quantum dots, quantum disks, quantum arch-shaped elements, quantum semi-polar planes, quantum wells, quantum dots with a shell, or similar quantum structures combinations thereof. In one implementation, the quantum active layer structure can include one or more $GaSb_xN_{1-x}$/GaN quantum dot layers, wherein x is greater than 0 and equal to or less than 1%.

Figure 2:
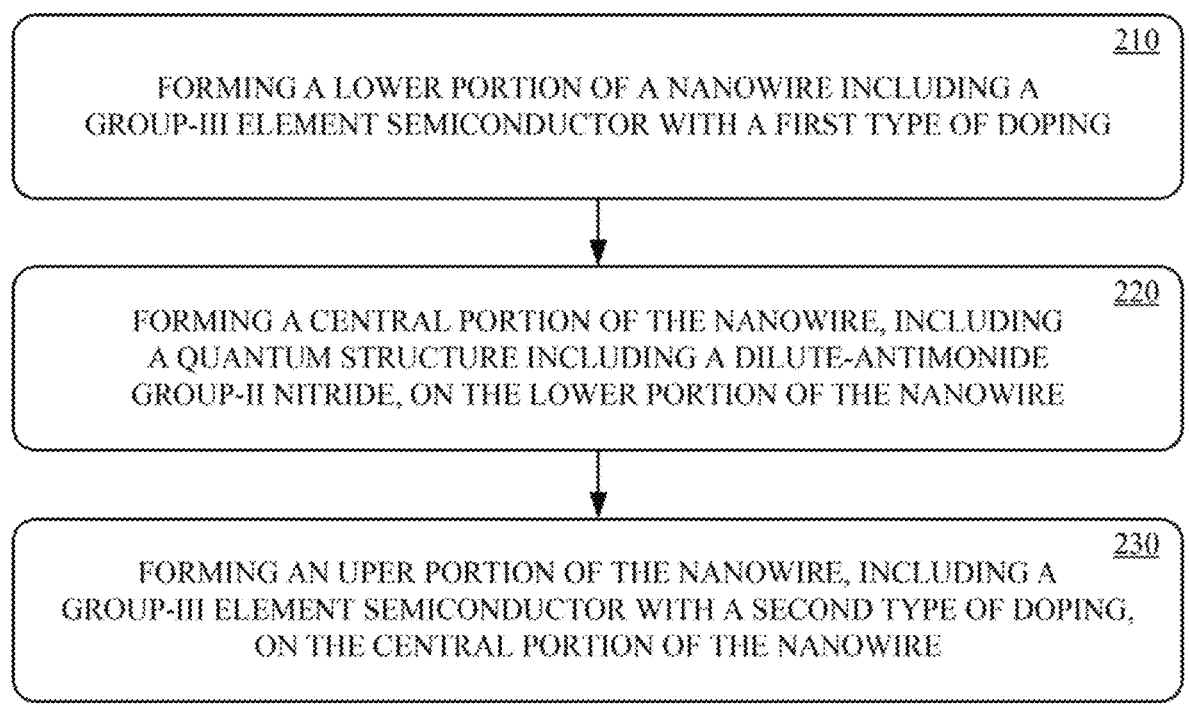
FIG. 2 shows a method of fabricating a nanowire, in accordance with aspects of the present technology.

Referring now to FIG. 2, a method of fabricating a nanowire, in accordance with aspects of the present technology, is shown. The method of fabricating the nanowire can include forming a lower portion of the nanowire 110 including a n-type doped group-III element semiconductor, at 210. In one implementation, the n-doped group-III element semiconductor can be formed by plasma-assisted molecular beam epitaxy of n-doped GaN on a n-doped silicon (Si) substrate.

At 220, a central portion of the nanowire 120 can be formed on the lower portion of the nanowire 110. The central portion of the nanowire can include a quantum well structure including a dilute-Antimonide (Sb) group-III-Nitride. In one implementation, the dilute-Antimonide (Sb) group-III-Nitride can be formed by plasma-assisted molecular beam epitaxy (MBE) of $GaSb_xN_{1-x}$/GaN, wherein x is greater than 0 and equal to or less than 1%.

At 230, an upper portion of the nanowire 130 can be formed on the central portion of the nanowire 120. The upper portion of the nanowire 130 can include a p-type doped group-III element semiconductor. In one implementation, the p-doped group-III element semiconductor can be formed by plasma-assisted molecular beam epitaxy of p-doped GaN.

More generally, in device applications, either a p-doped or n-doped group-III element semiconductor can be grown first at 210, followed by the deposition of the active region at 230, and a n-doped or p-doped group-III element semiconductor can be grown first at 230.

Figure 3:
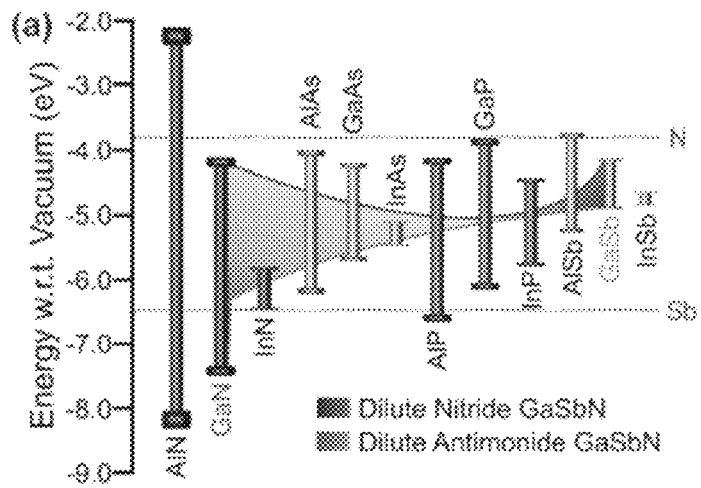
FIG. 3 shows an exemplary plot of theoretical ranges of bandgap energies for different group III-V semiconductors.

Referring now to FIG. 3, an exemplary plot of theoretical ranges of bandgap energies for different group III-V semiconductors, such as Aluminum Nitride (AlN), GaN, indium Nitride (InN), Aluminum Arsenide (AlAs) Gallium Arsenide (GaAs), Indium Arsenide (InAs), Aluminum Phosphide (AlP), Gallium Phosphide (GaP), Indium Phosphide (InP), Aluminum Antimonide (AlSb), Gallium Antimonide (GaSb) and Indium Antimonide (InSb), is shown. In addition, impurity levels of Antimony (Sb) and Nitride (N) with respect to the conduction band and valence band of group-III semiconductors is also shown.

Figure 4:
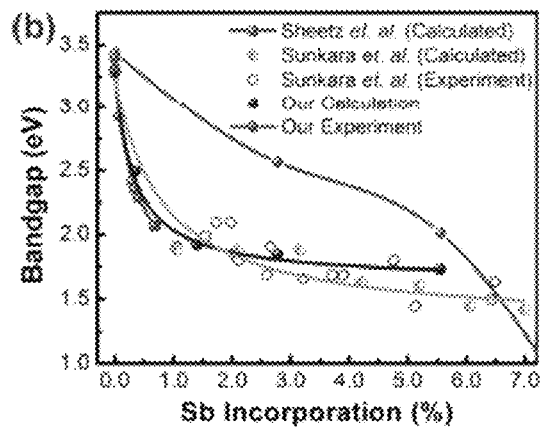
FIG. 4 shows exemplary calculated and experimental plots of the bandgap energy for GaSbN versus Sb concentrations.

Referring now to FIG. 4, exemplary calculated and experimental plots of the bandgap energy for GaSbN versus Sb concentrations is shown. The plots demonstrate that the energy bandgap can be controllably tuned in the dilute limit (<1%) for Sb.

Figure 5:
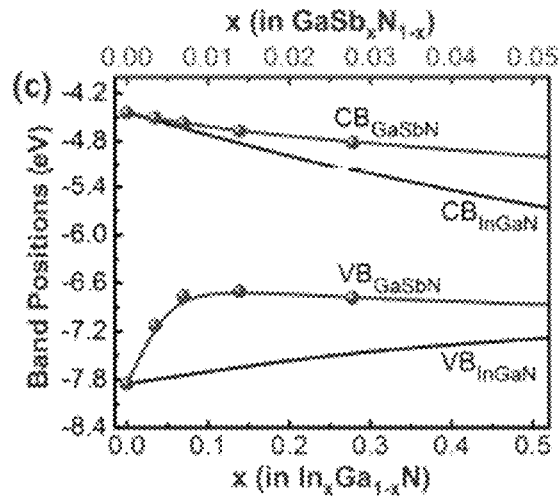
FIG. 5 shows an exemplary plot of the conduction and valence band edge position versus Sb concentration.

Referring now to FIG. 5, an exemplary plot of the conduction and valence band edge position versus Sb concentration is shown. For comparison the band edge position for Indium Gallium Nitride (InGaN), for compositions up to 50%, are also shown. The plot for $In_xGa_{1-x}N$ suggests that the bandgap variability would be a nearly linear change based on Sb concentration. However, in accordance with aspects of the present technology for concentration of Sb at or below 1% an unexpected and counterintuitive relationship between Sb concentration and the bandgap (eV) level is illustrated in the plot for $GaSb_xN_{1-x}$.

For FIG. 4, calculations on the electronic band gap and band structure of wurtzite GaSbN on low limit Sb concentration and its effect were performed using a computationally efficient method by the Vienna ab-initio simulation package (VASP), available from University of Vienna, Austria. Bandgaps of 3.28 eV and 0.55 eV were calculated for GaN and GaSb, respectively, by employing HSE06 exchange-correlation (XC) functional with the mixing parameter α=0.25 and adopting a 7×7×5 k-point mesh including spin-orbit interaction. A special quasi random structure (SQS) calculation (see, A. Zunger, S. H. Wei, L. G. Ferreira, and J. E. Bernard, Physical Review Letters 65 (3), 353 (1990) was used rather than conventional coherent potential approximation (CPA), to accurately obtain Sb atom arrangement which takes into account the local strain effect in the lattice. Lattice relaxation was performed using PBESol XC functional implemented in VASP. In the analysis, supercell sizes of 72, 144, 288, and 576 atoms were used to incorporate one Sb atom, which corresponds to Sb incorporations of 2.7, 1.35, 0.7, and 0.35% respectively. Energy bandgap calculation of $GaSb_xN_{1-x}$ versus (see, e.g., FIG. 4) captures the nonlinear curving part, while simultaneously providing accurate results as the commercial software Viena Ab-initio Simulation Package (VASP) for larger value of x. Here the bandgap is defined between the conduction band edge and the edge of the extended valence band states formed due to Sb incorporation. The band gap variation in these calculations is consistent with experiments described herein, as shown in FIG. 4. However, in direct contrast to the convention understanding of band edges of $In_xGa_{1-x}N$, the valence band edge was found to raise rapidly with x of Sb in $GaSb_xN_{1-x}$ while the conduction edge lowers slowly, as shown FIG. 5.

Figure 6:
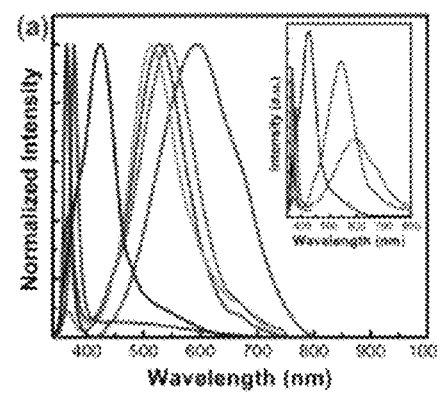
FIG. 6 shows a normalized photoluminescence spectra intensity with different exemplary Sb concentrations.

Referring now to FIG. 6, a normalized photoluminescence spectra intensity, measured at 300K, for GaSbN with different exemplary Sb concentrations is shown. The concentrations were varied between 0 to 1%. The insert shows the relative constant emission intensity of GaSbN nanowire arrays.

Figure 7:
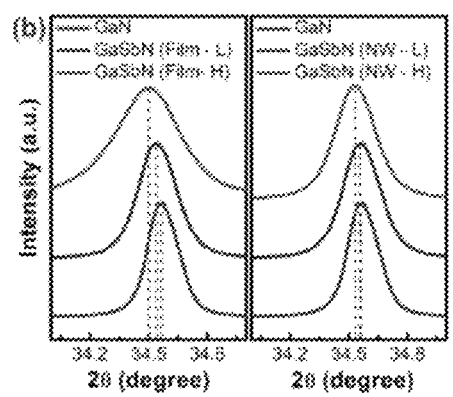
FIG. 7 shows an exemplary plot of prominent reflections of 002 in the XRD pattern for GaSbN films (left) and GaSbN nanowires (right) compared to that tor GaN.

Referring now to FIG. 7, an exemplary plot of prominent reflections of 002 in the XRD pattern for GaSbN films (left) and GaSbN nanowires (right) compared to that for GaN is shown. The 'L' and 'H' indicators refer to GaSbN samples with low and high Sb incorporation, respectively. The GaSbN nanowires grown on Si substrate can be vertically aligned on the substrate and oriented along the c-axis. The photoluminescence measurement was performed with a 325 nm He—Cd laser as the excitation source. Shown in FIG. 6 are the photoluminescence spectra of GaSbN obtained with different Sb concentrations into GaN. The Sb concentrations were varied in the range of 0% to 0.66%, which was derived based on the secondary ion mass spectroscopy (SIMS) measurements performed on GaSbN film structures grown under similar conditions. A consistent red shift with increasing Sb composition was measured, which suggests that the optical emission is not due the formation of localized defects. The estimated bandgap for different Sb incorporation is in excellent agreement with the theoretical calculation, illustrated in FIG. 7. By further varying the epitaxy conditions, emission in the deep visible spectral range can also be achieved.

For further characterization of the material properties, four samples with different Sb compositions, including both nanowire and film structures, were subsequently studied. The samples with high Sb incorporation are labeled with 'H' ($E_{g\ (NW-H)}$ approximately 2.03 eV, $E_{g\ (film-H)}$ approximately 2.27 eV), whereas low Sb samples are labeled with 'L' ($E_{g\ (NW-L)}$ approximately 2.34 eV, $E_{g\ (film-L)}$ approximately 2.90 eV). The Sb beam equivalent pressure (BEP) for the high and low Sb samples were $3\times10^{-8}$ and $5\times10^{-9}$ Torr, respectively. As predicted in the first principle calculation, anomalous expansion in unit cell size was observed for the alloy bandgap reduction which can be correlated with the measured structural and optical response of GaSbN. For example, to assess the structural quality of the alloy, XRD measurements were performed on both the nanowire and film samples using a Bruker D8 Advanced Diffractometer with Cu Kα (radiation λ=1.5418 Angstroms (Å)). The data reveal the typical (002) and (004) peaks observed in GaN wurtzite structure (not shown), confirming the wurtzite crystalline nature of the GaSbN grown along the c-axis. Depicted in FIG. 7, for higher Sb incorporation, the narrower (002) peak for GaSbN nanowires (FWHM approximately 857 arcsec) shows better crystalline quality than that of GaSbN film with a broader (002) peak (FWHM approximately 1253 arcsec). This can be attributed to the ability for accommodating strain-relaxed growth in one-dimensional (1D) GaSbN nanowires. The lattice constants of the samples with high and low Sb compositions, extracted from their XRD pattern are 5.1945 (H) and 5.1897 Å (L) for the films, and 5.1903 (H) and 5.1866 Å (L) for the nanowires, respectively. The lattice mismatch (f) of the GaSbN film ($E_{g\ (film-H)}$ approximately 2.27 eV) in comparison to GaN agrees well with that of our theoretical estimation for 0.4% Sb incorporation (f approximately 0.178%). However, the lattice mismatch was reduced significantly in GaSbN nanowire structure ($E_{g\ (NW-H)}$ approximately 2.03 eV, f approximately 0.085%) even for a smaller bandgap value, due to efficient lateral stress relaxation.

Figure 8:
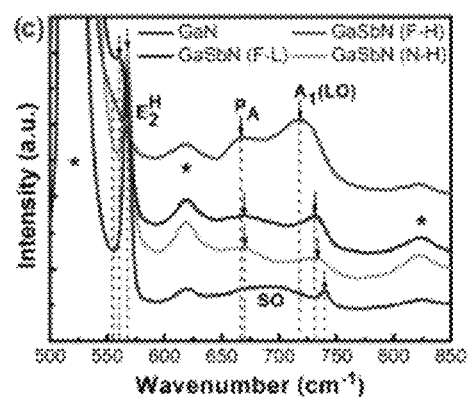
FIG. 8 shows an exemplary micro-Raman spectra of GaSbN films and nanowire versus Sb composition.

Referring now to FIG. 8, an exemplary micro-Raman spectra of GaSbN films and nanowire versus Sb composition is shown. Raman modes of GaN are also presented in FIG. 8 as reference, and contributions from a Si substrate are marked with an '*.'

The observation can further be correlated with the room-temperature micro-Raman spectroscopy analysis of the samples. Micro-Raman measurements were carried out with a 514 nm argon ion laser through a 50× objective. The focused laser spot size was approximately 1 μm and the estimated power on the sample was approximately 7 mW. In this study, all Raman spectra were taken in the backscattering geometry with the incident laser parallel to the hexagonal c-axis ([0001] direction) of the nanowires. FIG. 8 reveals the decoupling phenomenon of $A_1(LO)$ phonon mode from the longitudinal optical phonon-plasmon coupled (LOPC) mode, present at 740 $cm^{-1}$ in non-doped GaN. The $A_1(LO)$ phonon mode shifts consistently to lower frequency at increased Sb content with noticeable peak broadening. The additional peak ($P_A$), appeared at 670 $cm^{-1}$ for low Sb incorporation sample, shifts to lower frequency (667 $cm^{-1}$) with higher intensity as the Sb content increases in the host lattice, which can be attributed to Sb-induced local vibrational mode (LVM). This is consistent with the previous report where the additional peak and corresponding shift was observed near 650 cm$^{-1}$ for higher Sb incorporation (approximately 1-4%). The $E_2^H$ mode in GaSbN film is also largely affected due to Sb incorporation, and the peak shifts significantly to lower frequency with increased FWHM for higher Sb composition. This peak broadening and shift is due to biaxial strain in the c-plane, induced by the disorder in atomic arrangement, which is also instructive of reduced crystalline quality. However, the Raman scattering modes in GaSbN nanowire structures are affected only slightly due to the efficient lateral surface strain relaxation, and provides better crystalline quality (narrower $E_2^H$ peak) even at comparatively higher Sb incorporation, which can also be correlated with the lattice constants measured front XRD analysis in FIG. 7. In addition, post-growth annealing can enhance the optical properties of GaSbN nanowires.

Figure 9:
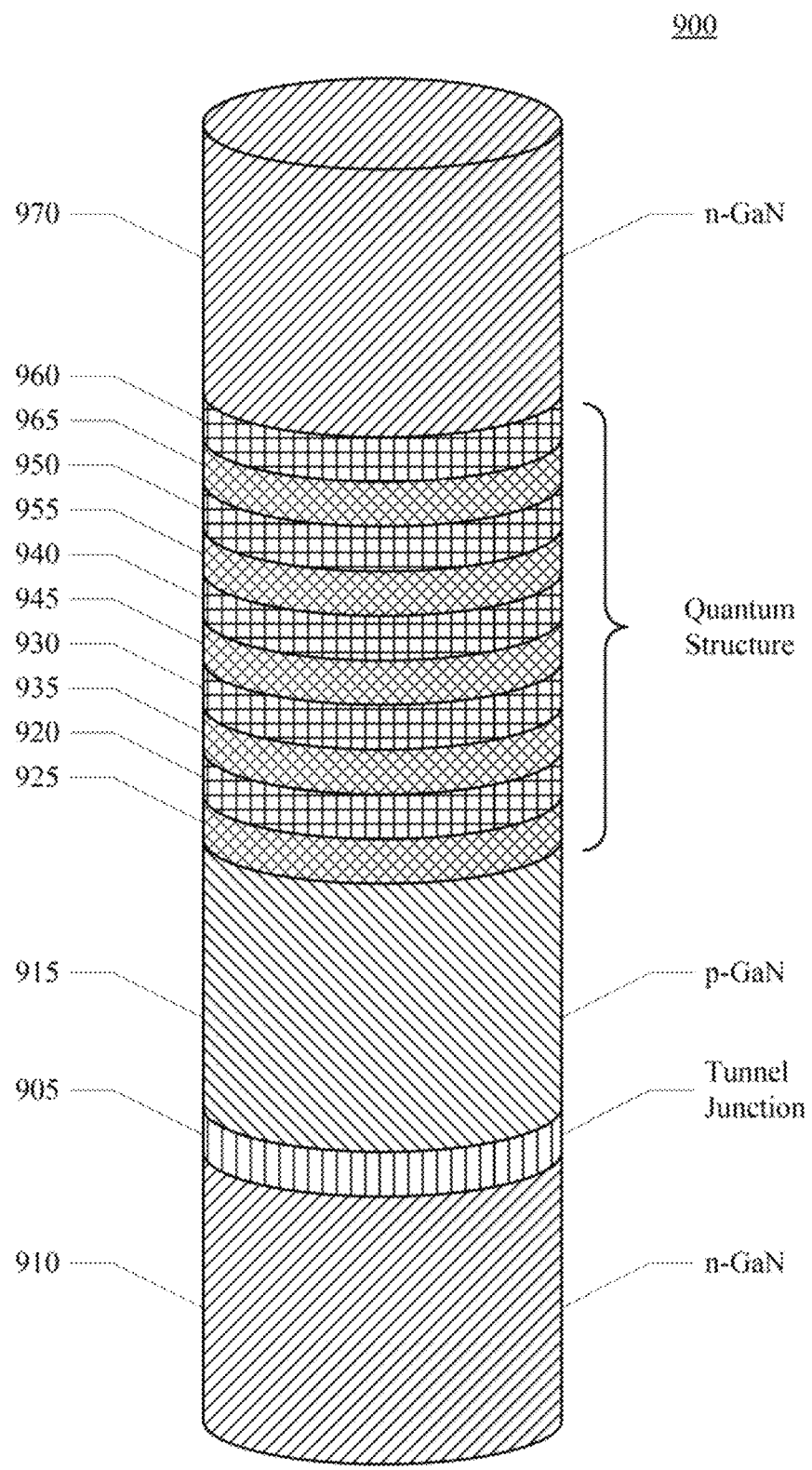
FIG. 9 shows a nanowire, in accordance with aspects of the present technology.

Referring now to FIG. 9, a nanowire, in accordance with aspects of the present technology, is shown. The nanowire 900 can include a tunnel junction 905 disposed between a n-type doped group-III element semiconductor 910 and a p-type doped group-III element semiconductor 915. In one implementation, the n-type doped group-III element semiconductor 910 can include n-type doped Gallium Nitride (GaN), and the p-type doped group-III element semiconductor 915 can be p-type doped Gallium Nitride (GaN). The tunnel junction 905 can include an aluminum (Al) layer disposed between a heavily n-type doped Gallium Nitride (n$^{++}$ GaN) and a heavily p-type doped Gallium Nitride (p$^{++}$ GaN). In another implementation, the tunnel junction 905 can include a heavily n-type doped Gallium Nitride (n$^{++}$ GaN) disposed on a heavily p-type doped Gallium Nitride (p$^{++}$ GaN). In yet another implementation, the tunnel junction 905 can include an Indium Gallium Nitride (InGaN) layer disposed between a heavily n-type doped Gallium Nitride (n$^{++}$ GaN) and a heavily p-type doped Gallium Nitride (p$^{++}$ GaN). The tunnel junction 905 can be configured to improve the efficiency of the optoelectronic nanowires.

The nanowire 900 can further include a quantum structure 925-960 disposed between the p-type doped group-III element semiconductor 915 and another n-type doped group-III element semiconductor 970. The quantum structure 925-960 can include one or more quantum dots. A quantum dot can include a layer of Gallium Nitride (GaN), 920 disposed on a dilute-Antimonide (Sb) group-III-Nitride, 925.

In the illustrated example of FIG. 9, the quantum layers 920-965 can be GaSbN/GaN quantum dot layers (also commonly referred to as "dot-in" nanowires). While quantum dot layers are shown in the illustrated example, the GaSbN/GaN quantum layers can be formed of quantum dots, quantum disks, quantum arch-shaped structures, quantum semi-polar planes, quantum wells, quantum dots in a shell, or other similar quantum structures or combination thereof. The nanowire 900 can have a cylindrical, hexagonal, rectangular, triangular, or similar cross section. Each nanowire 900 can be a quantum active region LED.

In aspects, the dilute-Antimonide quantum active layer structure can exhibit a strong photoluminescence emission at room temperature. Furthermore, the emission output can be tuned from approximately 3.4 to 2.0 electron Volts (eV) through controlled Antimony (Sb) into the nanowire heterostructures. The nanowire can therefore output light in the deep visible wavelengths (e.g., green). The tunability of the emission output can be based on the formation of valance band states, rather than localized defect states.

Figure 10:
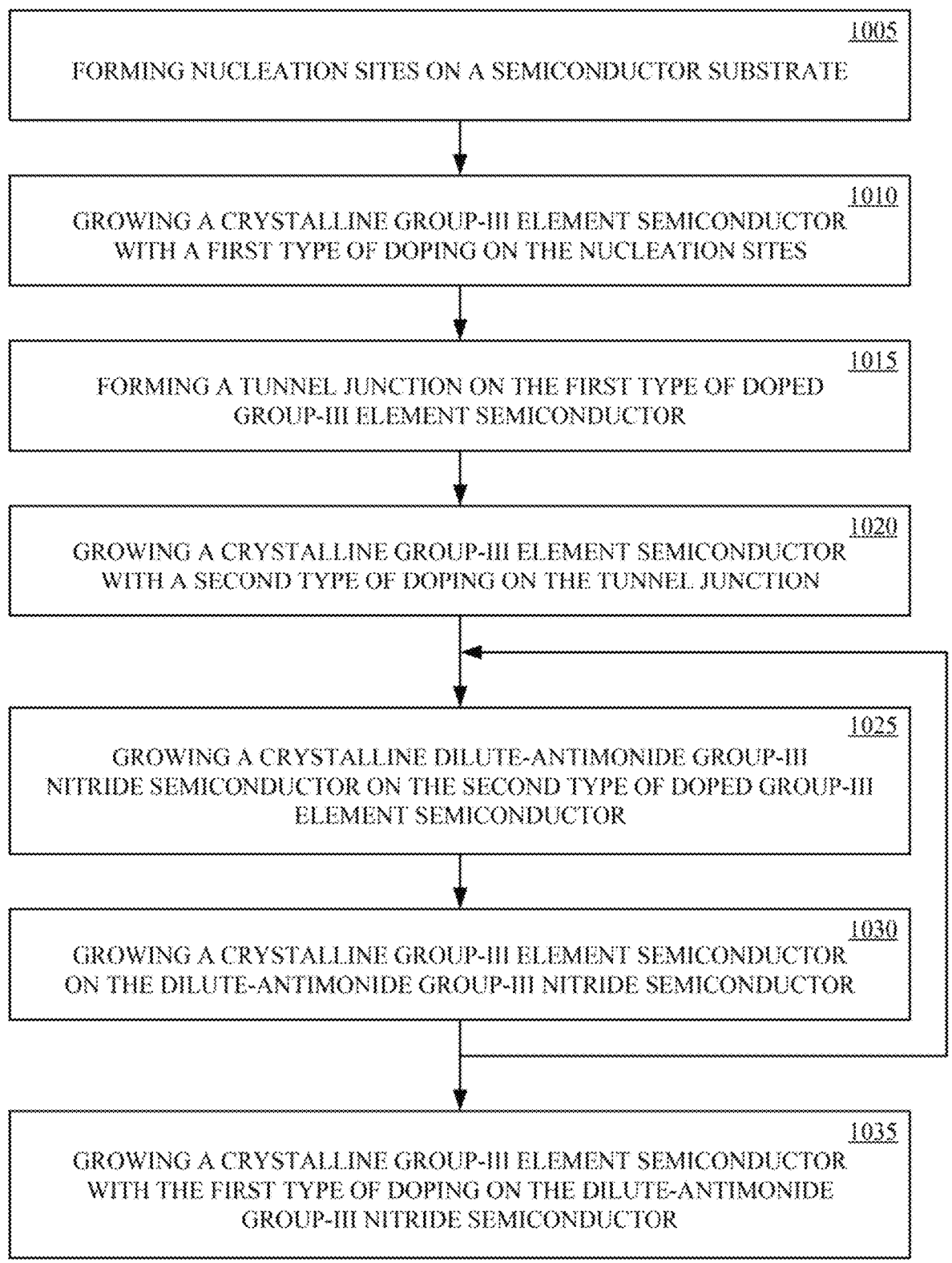
FIG. 10 shows a method of fabricating a nanowire, in accordance with aspects of the present technology.

Referring now to FIG. 10, a method of fabricating a nanowire, in accordance with aspects of the present technology, is shown. The method of fabrication can include forming nucleation sites on a substrate, at 1005. In one implementation, a Ga-seeding layer (approximately 1 monolayer) can be used for the nucleation of nanowires. A crystalline group-III element semiconductor with a first type of doping 910 can be grown on the nucleation sites on the substrate, at 1010. In one implementation, a n-type doped Gallium Nitride (GaN) layer can be epitaxial grown on a n-type doped silicon substrate. In one implementation, Germanium (Ge) can be used for the n-type dopant.

At 1015, a tunnel junction can be formed on the first type of doped group-III element semiconductor 910. In one implementation, a heavily n-type doped group-III element semiconductor, such as heavily n-type doped Gallium Nitride (n$^{++}$ GaN), can be epitaxially deposited on the n-type doped Gallium Nitride (GaN). A thin conductive layer, such as an Aluminum (Al), can be deposited on the heavily n-type doped Gallium Nitride (n$^{++}$ GaN). A thin Gallium (Ga) seed layer can be deposited at a low temperature on the Al layer, and then a heavily p-type doped Gallium Nitride (p$^{++}$ GaN) can be deposited on the seed layer to form a tunnel junction 905. In other implementations, the tunnel junction can include a heavily n-type doped Gallium Nitride (n$^{++}$ GaN) disposed on a heavily p-type doped Gallium Nitride (p$^{++}$ GaN), an indium Gallium Nitride (InGaN) layer disposed between a heavily n-type doped Gallium Nitride (n$^{++}$ GaN) and a heavily p-type doped Gallium Nitride (p$^{++}$ GaN), or any other applicable tunnel junction structure.

At 1020, a crystalline group-III element semiconductor with a second type of doping 915 can be grown on the tunnel junction 905. In one implementation, a p-type doped Gallium Nitride (GaN) layer can be epitaxially grown on the heavily p-type doped Gallium Nitride (p$^{++}$ GaN) of the tunnel junction 905. In one implementation Magnesium (Mg) can be used for the p-type dopant.

At 1025, a dilute-Antimonide (Sb) group-III-Nitride semiconductor 925 can be grown on the second type of doped group-III element semiconductor 915. In one implementation, a Gallium Antimonide Nitride (GaSbN) layer can be epitaxial grown on the p-type doped Gallium Nitride (GaN) layer to form a quantum dot. At 1025, a group-III element semiconductor 920 can be grown on the dilute-Antimonide (Sb) group-III-Nitride semiconductor 925. In one implementation, a substantially intrinsic Gallium Nitride (GaN) layer can be epitaxially grown. The Antimony (Sb) can be incorporated at a concentration of 1% or less. In one example, the GaSbN layer can be deposited using molecular beam epitaxy with a radio frequency plasma-assisted nitrogen source. The growth can be performed on a n-type Si substrate with a (111) lattice structure orientation, without external catalyst. Instead, a Ga-seeding layer (approximately 1 monolayer) can be used for the nucleation of nanowires. GaN-based heterostructures are conventionally grown at relatively high temperatures (e.g., 700° C.). However, controlled Sb incorporation at such high temperatures can be challenging due to the large Sb surface desorption and segregation. However, through the use of plasma-assisted molecular beam epitaxy, Sb can be controllably incorporated in GaN at intermediate growth temperatures. In one instance, growth parameters tor GaSbN nanowires can include substrate temperatures in the range of 650 to 705° C., Ga beam equivalent pressure of approximately $4\times10^{-8}$ Torr, and Sb beam equivalent pressure in the range of approximately $5\times10^{-10}$ to $1\times10^{-7}$ Torr. The nitrogen plasma power can be approximately 350 Watts and the nitrogen flow rate can be in the range of 0.3-0.5 standard cubic centimeter per minute (sccm).

The processes at 1020 and 1030 can be performed one or more times to form a quantum structure including one or more quantum dots. For example, the processes at 1025 and 1030 can be iteratively performed five times to form a quantum structure including five quantum dots as illustrated in FIG. 9. However, the illustrated example is not intended to be limiting. The nanowire in accordance with aspects of the present technology can be fabricated with any number of quantum dots or other multi-quantum structure.

At 1035, a crystalline group-III element semiconductor with the first type of doping 970 can be grown on the upper most group-III element semiconductor 960. In one implementation, a n-type doped Gallium Nitride (GaN) layer can be epitaxially grown on the substantially intrinsic Gallium Nitride (GaN) layer 960.

Figure 11:
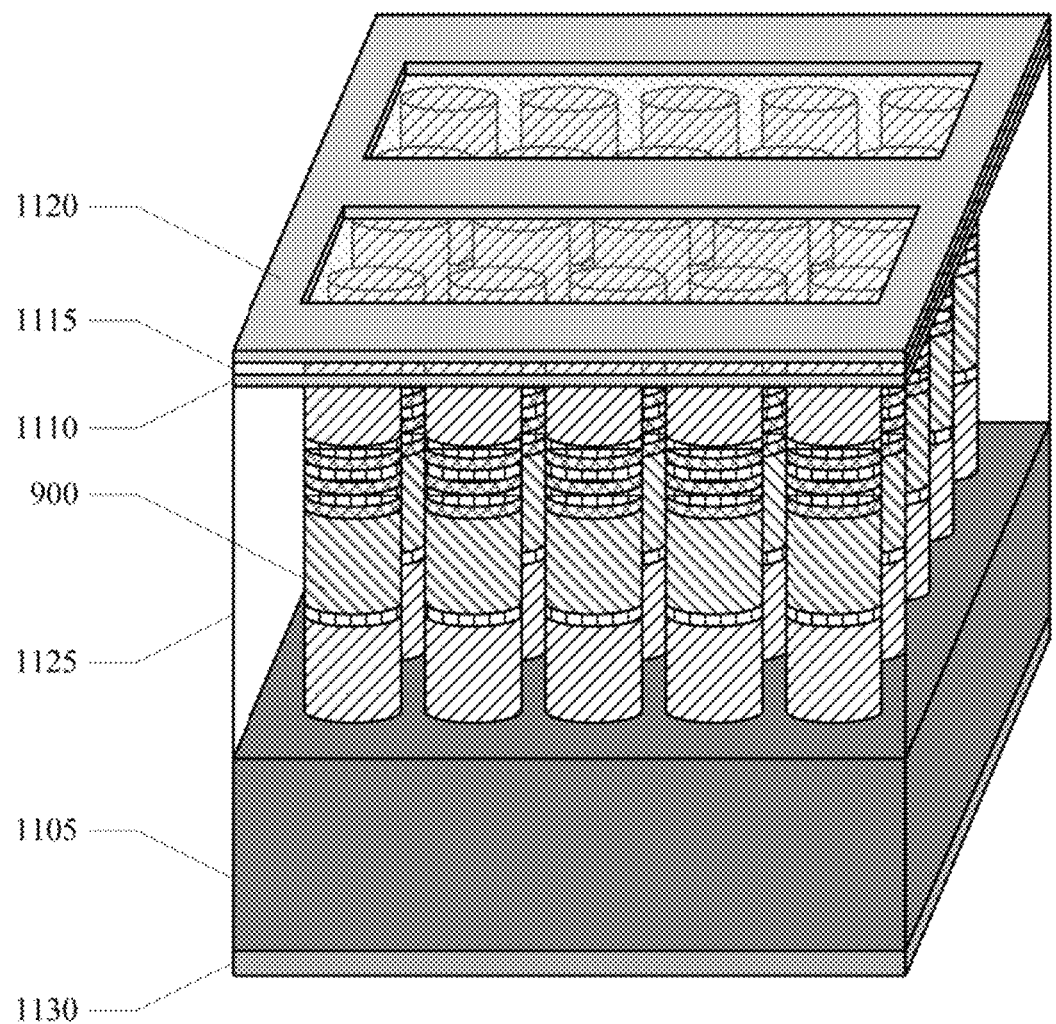
FIG. 11 shows a nanowire device, in accordance with aspects of the present technology.

Referring now to FIG. 11, a nanowire device, in accordance with aspects of the present technology, is shown. The nanowire device can include one or more clusters of nanowires 900 disposed on a substrate 1105. The nanowires can have a structure as described above with regard to FIGS. 1 and 9. In one implementation, different clusters of nanowires 900 can have different concentrations of dilute-Antimonide to reduce the bandgap energy by different amounts in different clusters of the nanowires 900. The different concentrations of dilute-Antimonide can result in different optical emissions within a range of 365 to 600 nanometers (nm) for the different clusters of nanowires. In another implementation, the nanowires in one or more clusters can have different concentrations of dilute-Antimonide a multi-colored solid-state light source. One or more first contacts 1110-1120 can be disposed on the one or more cluster of nanowires 900 opposite the substrate 1105. In one implementation, a plurality of first contacts 1110-1120 can be configured to couple to different clusters of nanowires 900. For example, FIG. 11 illustrates a single first contact 1110-1120 configured to be coupled to a cluster of twenty-five nanowires 900. The device can include one or more sets of clusters of nanowires 900 with corresponding separate first contacts 1110-1120. In one implementation, the one or more first contacts 1110-1120 can include a first layer 1110 of Nickle (Ni), Gold (Au) and/or NiAu alloys thereof, a second layer 1115 of Indium Tin Oxide (ITO) disposed on the first layer 1110 and coupled to the plurality of nanowires 900, and a third layer 1120 of Nickle (Ni), Gold (Au) and/or NiAu alloys thereof disposed on the second layer 1115. The second layer 1115 of ITO can be configured to permit light to pass through. The first and third layers 1110, 1120 can be configured to make good ohmic contact with the nanowires 900 through the second layer 1115, and can include one or more windows to permit light to pass through. The nanowires device can further include an optically transmissive layer 1125 disposed about the one or more clusters of nanowires 900 between the substrate and the one or more first contacts 1110-1120. In one implementation, the optically transmissive layer 1125 can be a polyimide. One or more second contacts 1130 can be disposed on the substrate 1105 opposite the one or more clusters of nanowires 900. The one or more second contacts 1130 can be electrically coupled to the nanowires 900 through the substrate 1105. In one implementation, the one or snore second contacts 1130 can include one or more layers of Titanium (Ti), Gold (Au) and/or TiAu alloys thereof. The substrate 1105 can be a heavily n-doped silicon (Si) substrate to make a good ohmic contact between the second contact 1130 and the one or more clusters of nanowires 900.

Figure 12:
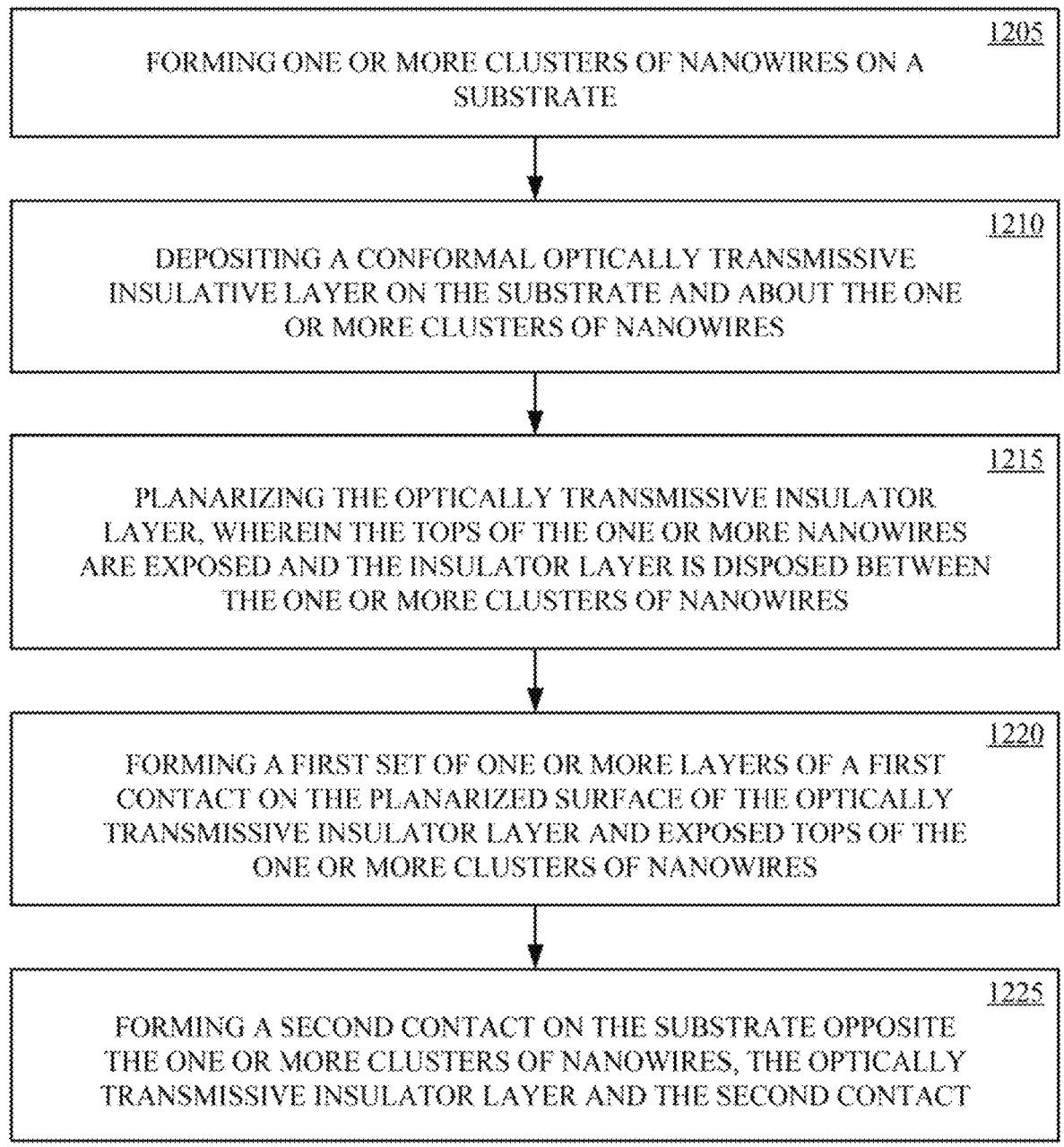
FIG. 12 shows a method of fabricating a nanowire device, in accordance with aspects of the present technology.

Referring now to FIG. 12, a method of fabricating a nanowire device, in accordance with aspects of the present technology, is shown. The method of fabrication can include forming one or more clusters of nanowires on a substrate, 1205. The nanowires can be formed on the substrate as described above with regard to FIGS. 2 and 10. At 1210, an optically transmissive insulator layer can be conformally deposited on the substrate about the one or more clusters of nanowires. In one implementation, the insulator layer can be an optically transmissive polyimide layer. At 1215, the insulative layer can be planarized, wherein tops of the one or more clusters of nanowires are exposed and the optically transmissive insulative layer is disposed between the one or more clusters of nanowires.

At 1220, a first set of one or more layers of a first contact can be deposited on the planarized surface of the optically transmissive insulator layer and the exposed tops of the one or more clusters of nanowires. The first set of one or more layers of the first contact can be electrically coupled to the one or more clusters of nanowires. In one implementation, a first layer of Nickle, Gold and/or alloys thereof can be deposited on the optically transmissive insulator layer and the exposed tops of the one or more clusters of nanowires. The first layer of Nickle (Ni), Gold (Au) and/or NiAu alloys thereof can be deposited as a very thin film that is configured to be substantially optically transmissive. Alternatively, a masking and selective etching process can be used to form one or more windows through the first layer of Nickle, Gold and/or alloys thereof. An Indium Fin Oxide (ITO) layer can be deposited on the first layer of Nickle (Ni), Gold (Au) and/or NiAu alloys thereof. The ITO layer can be configured to be optically transmissive. A second layer can be deposited on the ITO layer. A masking and selective etching process can be used to form one or more windows through the second layer of Nickle (Ni), Gold (Au) and/or NiAu alloys thereof. At 1225, a second contact can be deposited on the substrate opposite the one or more clusters of nanowires, the optically transmissive insulator layer and first contact. In one implementation, a layer of Titanium (Ti), Gold (Au) and/or TiAu alloys thereof can be deposited on the substrate to form the second contact.

Figure 13:
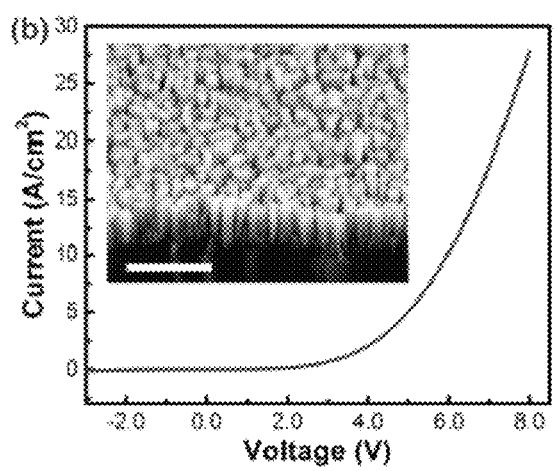
FIG. 13 shows a plot of the current versus voltage (I-V characteristic) of an exemplary GaSbN at room temperature.
Figure 14:
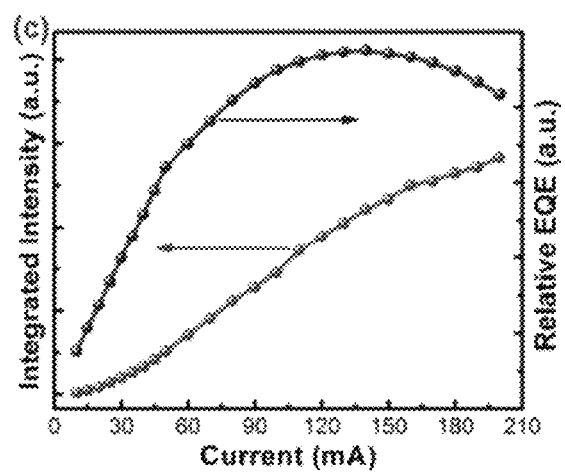
FIG. 14 shows a plot of an integrated intensity (L-I characteristic) and relative external quantum efficiency (EQE) for an exemplary GaSbN LED as a function of an injection current.
Figure 15:
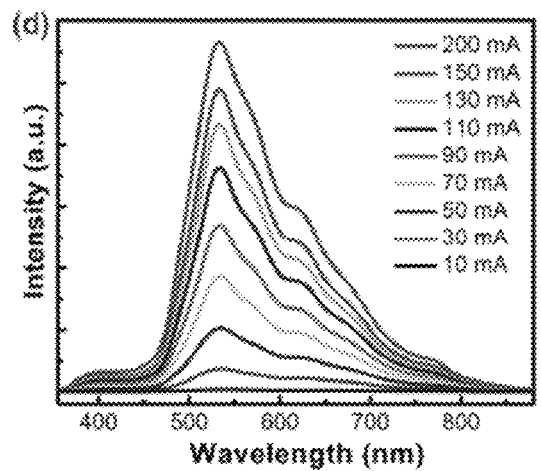
FIG. 15 shows a plot of an electroluminescence (EL) spectra (intensity) of an exemplary GaSbN LED under different pulsed biasing conditions with a 10% duty cycle at room temperature for different injection currents.

Referring now to FIG. 13, a plot of the current versus voltage (I-V characteristic) of an exemplary GaSbN at room temperature is shown. The inset shows a 45° tilted scanning electron microscope (SEM) image of an exemplary as grown GaSbN dot-in nanowire cluster (wherein the scale bar represents 1 micrometer (µm)). Referring now to FIG. 14, a plot of an integrated intensity (L-I characteristic) and relative external quantum efficiency (EQE) for an exemplary GaSbN LED as a function of an injection current is shown. Referring now to FIG. 15, a pot of an electroluminescence (EL) spectra (intensity) of an exemplary GaSbN LED under different pulsed biasing conditions with a 10% duty cycle at room temperature for different injection currents is shown.

In aspects of the present technology, strong quantum confinement was achieved in GaSbN/GaN quantum wells/dots with Sb concentration <1% in the active region. Moreover, the degree of quantum confinement and the emission wavelengths can be varied through controlled Sb incorporation. As illustrate in FIG. 9, a plurality of GaSbN (3 nm)/GaN (3 nm) quantum dots can be incorporated along the growth direction in the active region in a manner. The quantum dot active region was grown at relatively low substrate temperature of approximately 650° C. Other growth conditions are similar to those described for the GaSbN nanowire structures. A $n^{++}$-GaN/Al/$p^{++}$-GaN tunnel junction (TJ) were incorporated into the LED structure illustrated in FIG. 9. The scanning electron microscope (SEM) image, in the inset in FIG. 13, reveals the growth of vertically aligned GaSbN dot-in-nanowire arrays with relatively high uniformity and areal density.

In accordance with aspects of the present technology, the incorporation of a very small amount of Sb (>1%) in GaN can substantially reduce the energy bandgap of GaN from approximately 3.4 to 2 eV. By varying the concentration of Sb in the GaN can adjust the wavelength of the optical emission from approximately 365 to 600 nm at room temperature. Gallium Antimonide Nitride (GaSbN) nanowires and optoelectronic devices incorporating GaSbN nanowires exhibit strong photoluminescence emission within room temperature ranges. Furthermore, the emission output can be tuned from approximately 3.4 eV to approximated 2.0 eV through incorporating Antimony (Sb) into the heterostructures of the nanowire. Nanowires incorporating dilute-Sb group-III nitrides into quantum structures can operate in the deep visible range, and therefore can advantageously be utilized in high efficiency optoelectronic, photonic, and solar energy devices.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to therein enable others skilled in the art to best utilize the present technology and various embodiments with various modifications as are suited to the particular use contemplated. It is intended that the scope of the invention be defined by the claims appended hereto and their equivalents.

What is claimed is:

1. A nanowire comprising:
a first portion including a group-III element semiconductor with a first type of doping;
a second portion including one or more quantum structures including a dilute-Antimonide group-III-Nitride of one percent (1%) or less Antimony (Sb) disposed on the first portion; and
a third portion including a group-III element semiconductor with a second type of doping disposed on the second portion opposite the first portion.

2. The nanowire according to claim 1, wherein the group-III element semiconductor comprises Gallium (Ga).

3. The nanowire according to claim 1, wherein the group-III element semiconductor comprises Gallium Nitride (GaN).

4. The nanowire according to claim 1, wherein the one or more quantum structures comprises one or more set of quantum layers of Gallium Antimonide Nitride (GaSbN) and Gallium Nitride (GaN).

5. The nanowire according to claim 4, wherein the one or mere quantum structures comprises one or more structures of one or more layers of quantum dots, one or more layers of quantum disks, one or more layers of quantum arch-shaped elements, one or more layers of quantum wells, and one or more layers of quantum dots within a quantum well.

6. The nanowire according to claim 4, wherein the. Gallium Antimonide Nitride (GaSbN) further comprises $GaSb_xN_{1-x}$, wherein x is greater than zero (0) and less than one (1) percent.

7. The nanowire according to claim 1, wherein the nanowire is a Light Emitting Diode (LED).

8. The nanowire according to claim 1, wherein the nanowire includes a cylindrical, hexagonal, rectangular, or triangular cross-section.

9. A device comprising:
one or more clusters of nanowires, the nanowires including;
a first semiconductor region;
a quantum structure, disposed on the first semiconductor region, including a dilute-Antimonide group-III Nitride of less than one percent (1%) of Antimony (Sb); and
a second semiconductor region disposed on the quantum structure.

10. The device of claim 9, wherein the concentration of Antimony (Sb) varies between one or more different clusters of nanowires.

11. The device of Claim 9, wherein the concentration of Antimony (Sb) varies between nanowires in the one or more cluster of nanowires.

12. The device of claim 9, wherein the dilute-Antimonide group-III Nitride comprises Gallium Antimonide Nitride (GaSbN).

13. The device of claim 9, wherein:
the first semiconductor region comprises a n-doped Gallium Nitride (GaN); and
the second semiconductor region comprises a p-doped Gallium Nitride (GaN).

14. The device of claim 9, wherein the quantum structure comprises one or more layers of quantum dots, one or more layers of quantum disks, one or more layers of quantum arch-shaped elements, one or more layers of quantum wells, and one or more layers of quantum dots within a quantum well.

15. The device of claim 9, wherein the quantum structure comprises:
a first layer of Gallium Antimonide Nitride (GaSbN); and
a second layer of Gallium Nitride (GaN) disposed on the first layer.

16. The device of claim 15, wherein the quantum structure further comprises:
a third layer of Gallium Antimonide Nitride (GaSbN) on the second layer; and
a fourth layer of Gallium Nitride (GaN) disposed on the third layer.

17. The device of claim 9, further comprising;
a third semiconductor region disposed on a substrate;
a tunnel junction disposed on the third semiconductor region; and
the first semiconductor region disposed on the tunnel junction.

18. The device of claim 17, wherein:
the first semiconductor reion comprises a p-doped Gallium Nitride (GaN);
the second semiconductor region comprises a n-doped Gallium Nitride (GaN);
the third semiconductor region comprises the n-doped Gallium Nitride (GaN).

19. The device of claim 17, wherein the tunnel junction comprise
a heavily n-type doped Gallium Nitride ($n^{++}$GaN);
an Aluminum (Al) layer disposed the heavily n-type doped Gallium Nitride ($n^{++}$ GaN); and
a heavily p-type doped Gallium Nitride ($p^{++}$ GaN) disposed on the Aluminum (Al) layer.

20. The device of claim 17, further comprising:
a first contact disposed on the one or more cluster of nanowires and the optically transmissive insulator layer opposite the substrate, wherein the second contact is electrically coupled to the one or more cluster of nanowires;

an optically transmissive insulator layer disposed between the nanowires; and a second contact disposed on the substrate opposite the one or more clusters of nanowires, wherein the first contact is electrically coupled to the one or more clusters of nanowires through the substrate.

21. The device of claim 20, wherein the first contact comprises:

a first layer of Nickle (Ni), Gold (Au) or NiAu alloy, disposed on the one or more cluster of nanowires and the optically transmissive insulator layer, that is at least partial optically transmissive;

a layer of Indium Tin Oxide (ITO), disposed on the first layer of Nickle (Ni), Gold (Au) or NiAu alloy, that is substantially optically transmissive; and a second layer of Nickle (Ni), Gold (Au) or NiAu alloy, disposed on the layer of Indium Tin Oxide (ITO), that is at least partial optically transmissive.

* * * * *